(12) United States Patent
Hou et al.

(10) Patent No.: US 8,993,432 B2
(45) Date of Patent: Mar. 31, 2015

(54) TEST STRUCTURE AND METHOD OF TESTING ELECTRICAL CHARACTERISTICS OF THROUGH VIAS

(75) Inventors: Shang-Yun Hou, Hsin-Chu (TW); Wei-Cheng Wu, Hsin-Chu (TW); Hsien-Pin Hu, Zhubei (TW); Jung Cheng Ko, Taichung (TW); Shin-Puu Jeng, Hsin-Chu (TW); Chen-Hua Yu, Hsin-Chu (TW); Kim Hong Chen, Fremont, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 605 days.

(21) Appl. No.: 13/297,779

(22) Filed: Nov. 16, 2011

(65) Prior Publication Data

US 2013/0120018 A1    May 16, 2013

(51) Int. Cl.
*H01L 21/44* (2006.01)
*H01L 21/66* (2006.01)
*H01L 21/768* (2006.01)
*H01L 23/00* (2006.01)

(52) U.S. Cl.
CPC ........... *H01L 22/14* (2013.01); *H01L 21/76898* (2013.01); *H01L 24/11* (2013.01); *H01L 24/13* (2013.01); *H01L 2224/1147* (2013.01); *H01L 2224/13025* (2013.01); *H01L 2224/13111* (2013.01); *H01L 2224/13116* (2013.01); *H01L 2224/13124* (2013.01); *H01L 2224/13147* (2013.01); *H01L 2224/13155* (2013.01); *H01L 2224/13169* (2013.01); *H01L 2224/0557* (2013.01)
USPC .................... 438/614; 438/667; 257/E21.597

(58) Field of Classification Search
USPC ...................................................... 438/18, 668
See application file for complete search history.

(56) References Cited

U.S. PATENT DOCUMENTS

| | | | |
|---|---|---|---|
| 7,781,235 B2 * | 8/2010 | Luo et al. | 438/14 |
| 8,193,039 B2 * | 6/2012 | Su et al. | 438/113 |
| 8,294,149 B2 * | 10/2012 | Bernstein et al. | 257/48 |

* cited by examiner

*Primary Examiner* — Chandra Chaudhari
(74) *Attorney, Agent, or Firm* — Slater & Matsil, L.L.P.

(57) ABSTRACT

A method and apparatus for testing the electrical characteristics, such as electrical continuity, is provided. A substrate, such as a wafer or an interposer, having a plurality of through vias (TVs) is provided. Along one side of the substrate, a conductive layer electrically couples two or more of the TVs. Thereafter, the electrical characteristics of the TVs may be test by, for example, a probe card in electrical contact with the TVs on the other side of the substrate. During testing, current passes through a first TV from a first side of the substrate, to the conductive layer on a second side of the substrate, to a second TV, and back to the first side of the substrate through the second TV.

20 Claims, 7 Drawing Sheets

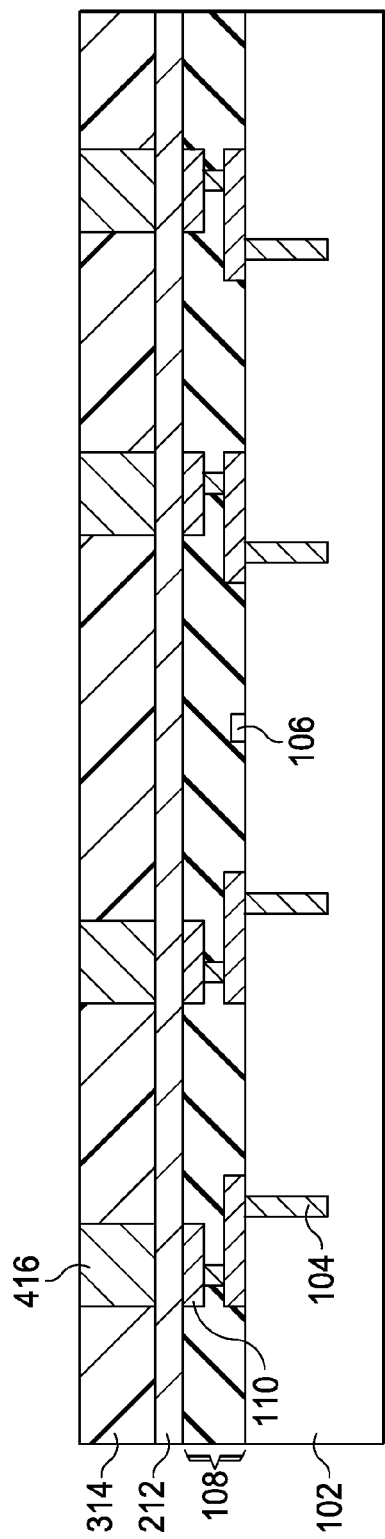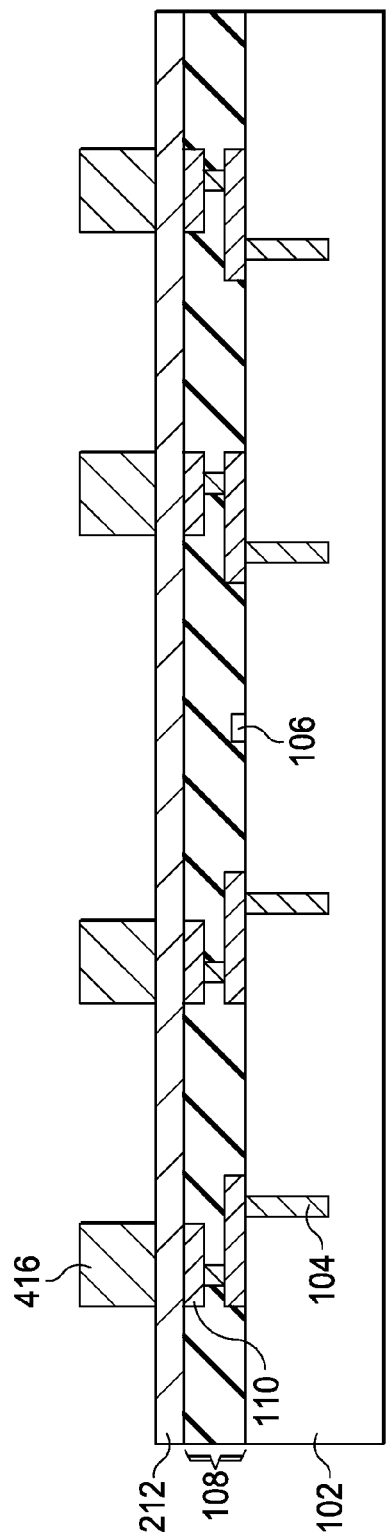

TEST STRUCTURE AND METHOD OF TESTING ELECTRICAL CHARACTERISTICS OF THROUGH VIAS

BACKGROUND

Since the invention of the integrated circuit (IC), the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through vias (TVs), such as through silicon vias. Generally, a TV provides connectivity from one side of a substrate to another side of the substrate, thereby allowing semiconductor devices on a first side to electrically communicate with devices on a second side of the substrate. TVs, however, are difficult to test at both the die level and the wafer level.

Generally, chips (before and/or after dicing) are probed with test devices to determine the "known good dies." Only the known good dies are used in subsequent processing, e.g., packaging. In the case of TVs, testing typically required probing both sides of the substrate in order to ensure that the electrical characteristics of the TVs are within acceptable limits. Probing both sides of the substrate, however, requires complicated equipment, time consuming, and expensive.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1-11 illustrate intermediate stages in a manufacture of a device in accordance with an embodiment.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use specific embodiments, and do not limit the scope of the disclosure.

A novel method of and system for probing semiconductor devices, such as individual dies after dicing, wafers, stacked dies and/or wafers, are discussed. The intermediate stages of manufacturing a die and/or wafer are illustrated. Even though embodiments discussed herein are in the context of a wafer having integrated circuits formed thereon, other embodiments may utilize different substrates, such as an interposer with or without active/passive elements. Throughout the various views and illustrative embodiments of the present disclosure, like reference numbers are used to designate like elements.

Figure 1:
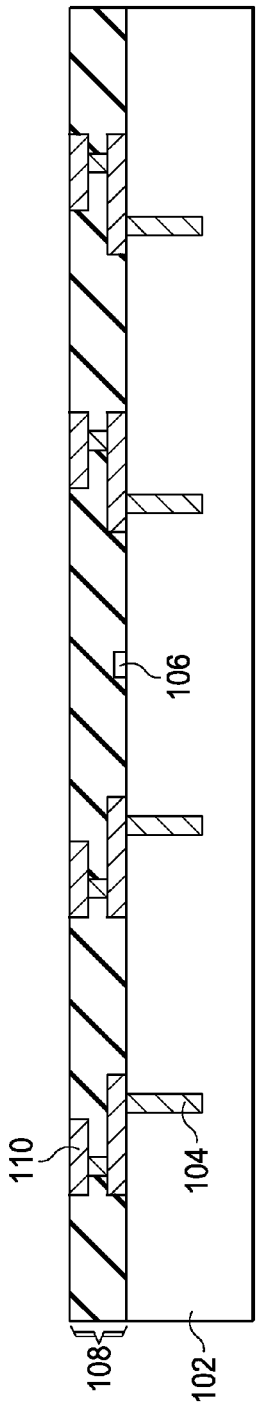

FIGS. 1-11 illustrate various intermediate stages of a method of forming a semiconductor device in accordance with an embodiment. Referring first to FIG. 1, a portion of a substrate 102 having one or more through vias (TVs) 104 formed therein is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. It should be noted that the substrate 102 may be a processed wafer having integrated circuits formed thereon, an interposer, packaging substrate, mounting substrate, or the like having limited or no electrical circuitry formed thereon.

The TVs 104 provide an electrical connection from one side of the substrate 102 to another side of the substrate 102. In this manner, electrical circuitry formed on one side the substrate 102 or electrical devices, such as a semiconductor die and/or wafer, connected to one side of the substrate may be electrically connected to devices and/or other electrical components formed on or attached to the other side of the substrate 102.

The TVs 104 may be formed by any appropriate method. For example, openings may be formed extending into the substrate 102 by, for example, one or more etching processes, milling, laser techniques, or the like. In some embodiments, the openings may be lined with a liner, e.g., TEOS, that acts as an isolation layer. As will be discussed in greater detail below, portions of the TVs 104 will be exposed along the backside of the substrate 102 to form electrical connections.

Optionally, electrical circuitry, represented by reference numeral 106, may be formed on the substrate 102 and may comprise any type of circuitry suitable for a particular application. In an embodiment, the electrical circuitry 106 includes electrical devices formed on the substrate 102 with one or more dielectric layers overlying the electrical devices. Metal layers may be formed between dielectric layers to route electrical signals between the electrical devices. Electrical devices may also be formed in one or more dielectric layers.

For example, the electrical circuitry 106 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application. It should be noted, however, that the substrate 102 may be an interposer, in which case the substrate 102 may have no or limited electrical circuitry formed thereon.

Also shown in FIG. 1 are interconnection layers 108, such as an inter-layer dielectric (ILD) layer and one or more inter-metallization dielectric (IMD) layers. The interconnection layers 108 may be formed, for example, of a dielectric material, including a low-K dielectric material such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma CVD (HDPCVD), or the like, and may include intermediate etch stop layers. It should also be noted that the interconnection layers 108 may comprise a plurality of dielectric layers.

The interconnection layers 108 may also include one or more metallization layers. Generally, the one or more IMD layers and the associated metallization layers are used to interconnect the electrical circuitry 106 to each other and/or to provide an external electrical connection. Contacts 110 are provided in the uppermost IMD layer to provide external electrical connections.

The interconnection layers 108 may further include a protective layer. The protective layer be formed of a dielectric material, such as SiN, a plasma-enhance oxide (PEOX), a plasma-enhanced SiN (PE-SiN), plasma-enhanced undoped silicate glass (PE-USG), or the like, and patterned over the surface of the uppermost IMD layer to provide an opening over the contacts 110 and to protect the underlying layers from various environmental contaminants.

As one of ordinary skill in the art will realize, the above description provides a general description of the features of the embodiment and that numerous other features may be present. For example, other circuitry, liners, barrier layers, under-bump metallization configurations, redistribution layer (RDL), and the like, may be present. The above description is meant only to provide a context for embodiments discussed herein and is not meant to limit the disclosure or the scope of any claims to those specific embodiments. Any suitable process may be used to form the structures discussed above and will not be discussed in greater detail herein.

It should also be noted that a via-first configuration for the TVs 104 is shown for illustrative purposes only. Other embodiments may utilize other TV configurations, such as a via-last configuration. As such, the TVs may extend through one or more of the ILD layers and/or IMD layers, as well as extending through the uppermost IMD layer, may also be used.

Figure 2:
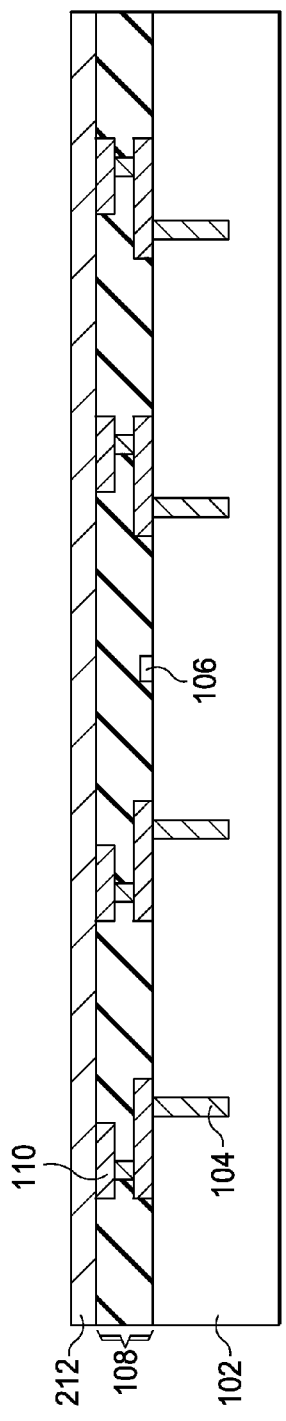

Referring now to FIG. 2, a conductive layer 212 is formed over the contacts 110. The conductive layer 212 acts to temporarily electrically interconnect the contacts 110 for, e.g., test purposes. In an embodiment, the conductive layer 212 is a thin layer of a conductive material. The conductive layer 212 may act as a seed layer by aiding in the formation of a thicker layer during subsequent processing steps to help form conductive pillars and/or conductive bumps to be used in bonding the substrate 102 to another surface, such as another die, wafer, interposer, mounting substrate, PCB, packaging substrate, or the like. In an embodiment, the conductive layer 212 may be formed by depositing a thin conductive layer, such as a thin layer of Cu, Ti, Ta, TiN, TaN, combinations thereof, or the like, using CVD or physical vapor deposition (PVD) techniques. For example, a layer of Ti is deposited by a PVD process to form a barrier film and a layer of Cu is deposited by a PVD process to form the conductive layer 212.

As noted above, the conductive layer 212 acts to electrically interconnect the contacts 110 for test purposes. As such, the conductive layer 212 is formed to a thickness sufficient to test the electrical characteristics of the TVs. In an embodiment, the conductive layer 212 is formed to a thickness of about 1,000 Å to about 50,000 Å. In other embodiments, smaller or larger thicknesses may be used.

Figure 3:
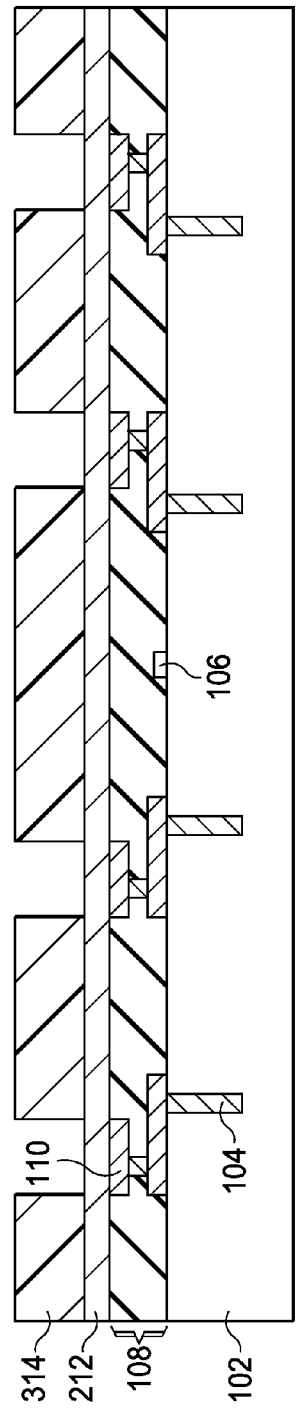

Thereafter, as illustrated in FIG. 3, a patterned mask 314 is formed and patterned over the conductive layer 212 in accordance with an embodiment. The patterned mask 314 defines the lateral boundaries of conductive pillars and/or bumps to be subsequently formed as discussed in greater detail below. The patterned mask 314 may be a patterned photoresist mask, hard mask, a combination thereof, or the like.

FIG. 4 illustrates the formation of first conductive bumps 416, which form an external electrical contact, in accordance with an embodiment. The first conductive bumps 416 may be formed of any suitable conductive material, including Cu, Ni, Pt, Al, electroless nickel immersion gold ("ENIG"), electroless nickel electroless palladium immersion gold ("ENEPIG"), a solder material (e.g., SnPb, a high-Pb material, a Sn-based solder, a lead-free solder), combinations thereof, or the like, and may be formed through any number of suitable techniques, including PVD, CVD, electrochemical deposition (ECD), molecular beam epitaxy (MBE), atomic layer deposition (ALD), electroplating, and the like. In some embodiments, the first conductive bumps 416 may include a conductive pillar with an overlying solder bump. In these embodiments, it may be desirable to form an optional cap layer between the pillar and the solder bump. During the soldering process, an inter-metallic compound (IMC) layer (not shown) may be naturally formed at the joint between the solder material and the underlying surface. It has been found that some materials may create a stronger, more durable IMC layer than others. As such, it may be desirable to form a cap layer to provide an IMC layer having more desirable characteristics. For example, in an embodiment in which the conductive pillar is formed of copper, a cap layer formed of nickel may be desirable. Other materials, such as Pt, Au, Ag, combinations thereof, or the like, may also be used.

Thereafter, as illustrated in FIG. 5, the patterned mask 314 may be removed. In embodiments in which the patterned mask 314 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process.

Figure 6:
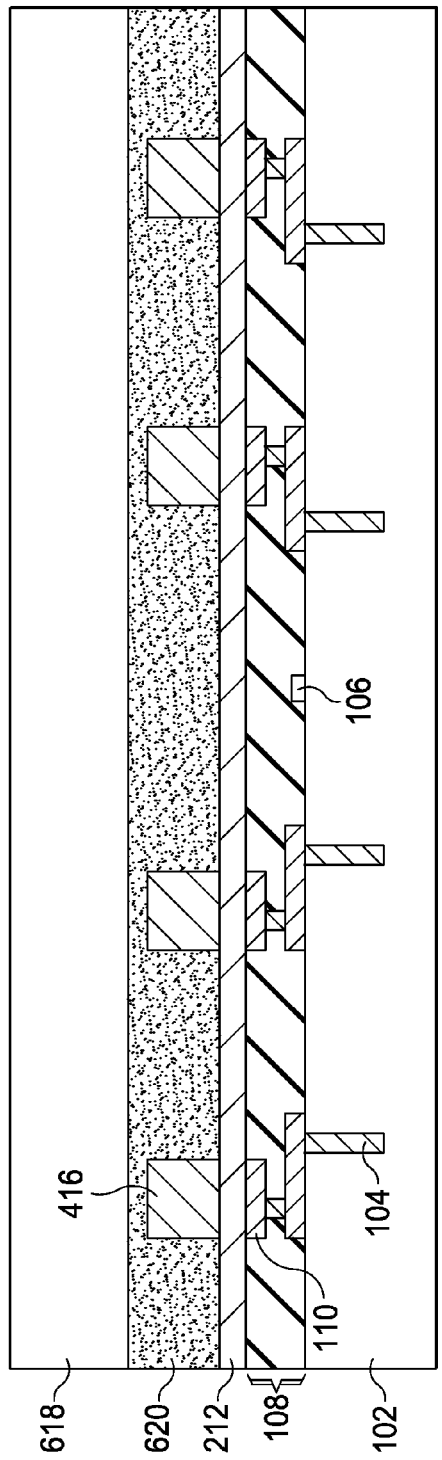

FIG. 6 illustrates the attachment of a first carrier wafer 618 to the substrate 102 in accordance with an embodiment. Generally, the first carrier wafer 618 provides temporary mechanical and structural support to the substrate 102 during subsequent processing steps. In this manner, damage to the substrate 102 is reduced or prevented. The first carrier wafer 618 may comprise, for example, glass, silicon oxide, aluminum oxide, and the like. In an embodiment, a first adhesive 620 is used to attach the first carrier wafer 618. The adhesive may be any suitable adhesive, such as an ultraviolet (UV) glue, which loses its adhesive property when exposed to UV lights.

Figure 7:
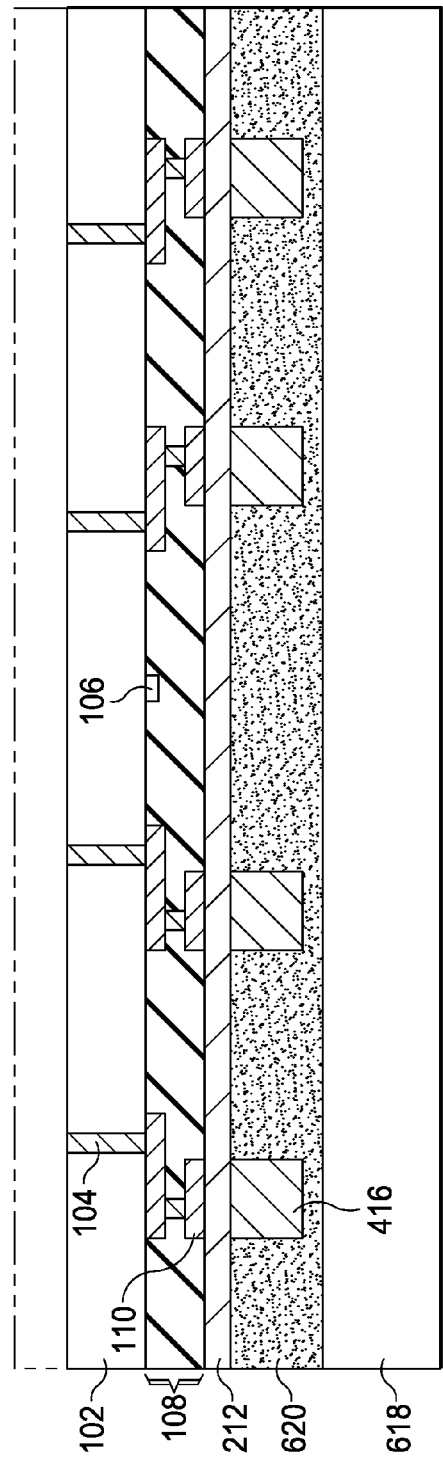

Once the first carrier wafer 618 is attached, a thinning process may be performed on a backside of the substrate 102 to expose the TVs 104 in accordance with an embodiment as illustrated in FIG. 7. The thinning process may be performed using an etching process and/or a planarization process, such as a mechanical grinding process or a chemical mechanical polishing (CMP) process. In some embodiments, the substrate 102 may be thinned such that the TVs 104 protrude from the backside of the substrate 102. For example, initially a planarizing process, such as grinding or a CMP, may be performed to initially expose the TVs 104. Thereafter, one or more wet etching processes may be performed, thereby leaving the TVs 104 protruding from the backside of the substrate 102. The etch process may be, for example, a dry etch process using $HBr/O_2$, $HBr/Cl_2/O_2$, $SF_6/CL_2$, $SF_6$ plasma, or the like. It should be noted, however, that in other embodiments, the TVs 104 may not protrude from the backside of the substrate 102.

Figure 8:
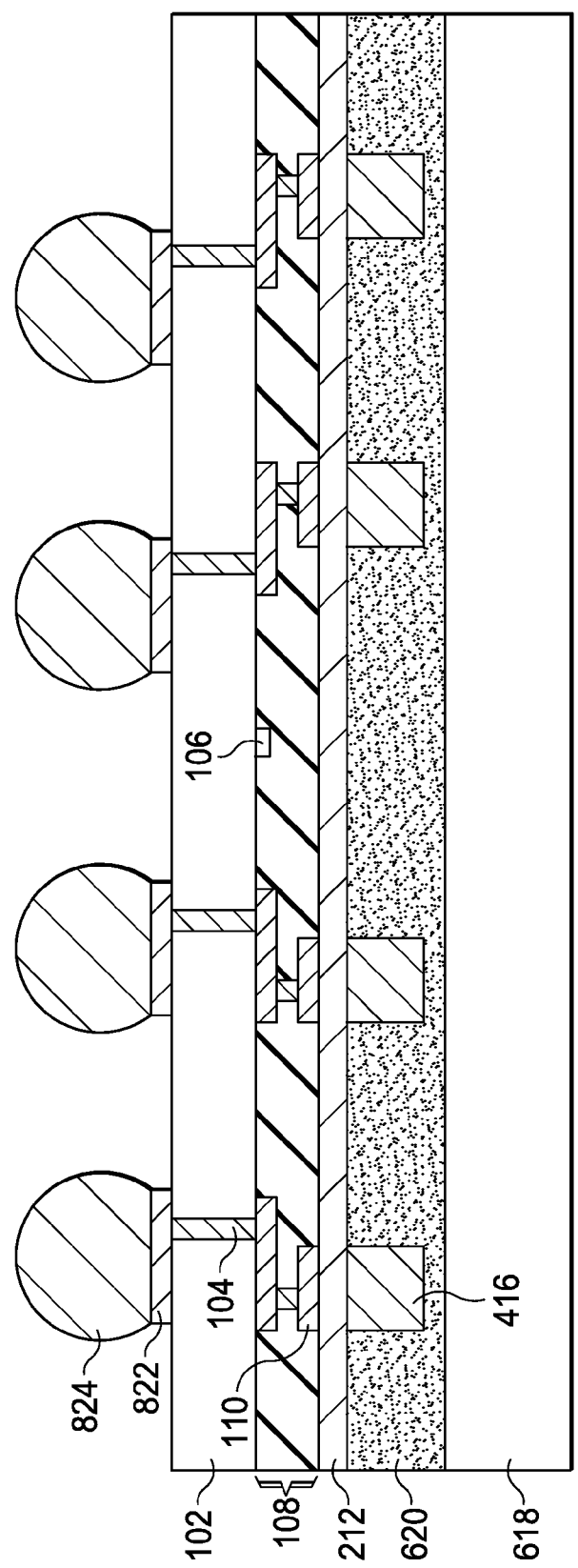

FIG. 8 depicts forming under-bump metallization (UBM) structures 822 and second conductive bumps 824 in accordance with an embodiment. The UBM structures 822 are formed of one or more layers of conductive materials and provide an electrical connection between the underlying TVs 104 and the second conductive bumps 824, e.g., solder bumps, to be formed in subsequent processing steps. The UBM structures 822 may be formed, for example, of one or more layers of chrome, a chrome-copper alloy, copper, gold, titanium, titanium tungsten, nickel, combinations thereof, or the like. The second conductive bumps 824 placed on select ones of the UBM structures 822. The second conductive bumps 824 may be formed of a eutectic solder, lead free solder, or the like.

It should be noted that the UBM structures 822 and the second conductive bumps 824 are provided for illustrative purposes only and that other suitable structures, such as a conductive pillar (with or without solder) may also be used. It should further be noted that various other elements may be present. For example, various passivation layers, liners, capping layers, and the like may be included. Furthermore, the UBM structures 822 may also include a redistribution layer (RDL) to form connections that run horizontally and reroute the TVs 104 to a different location, thereby providing flexibility in the solder ball placement.

Figure 9:
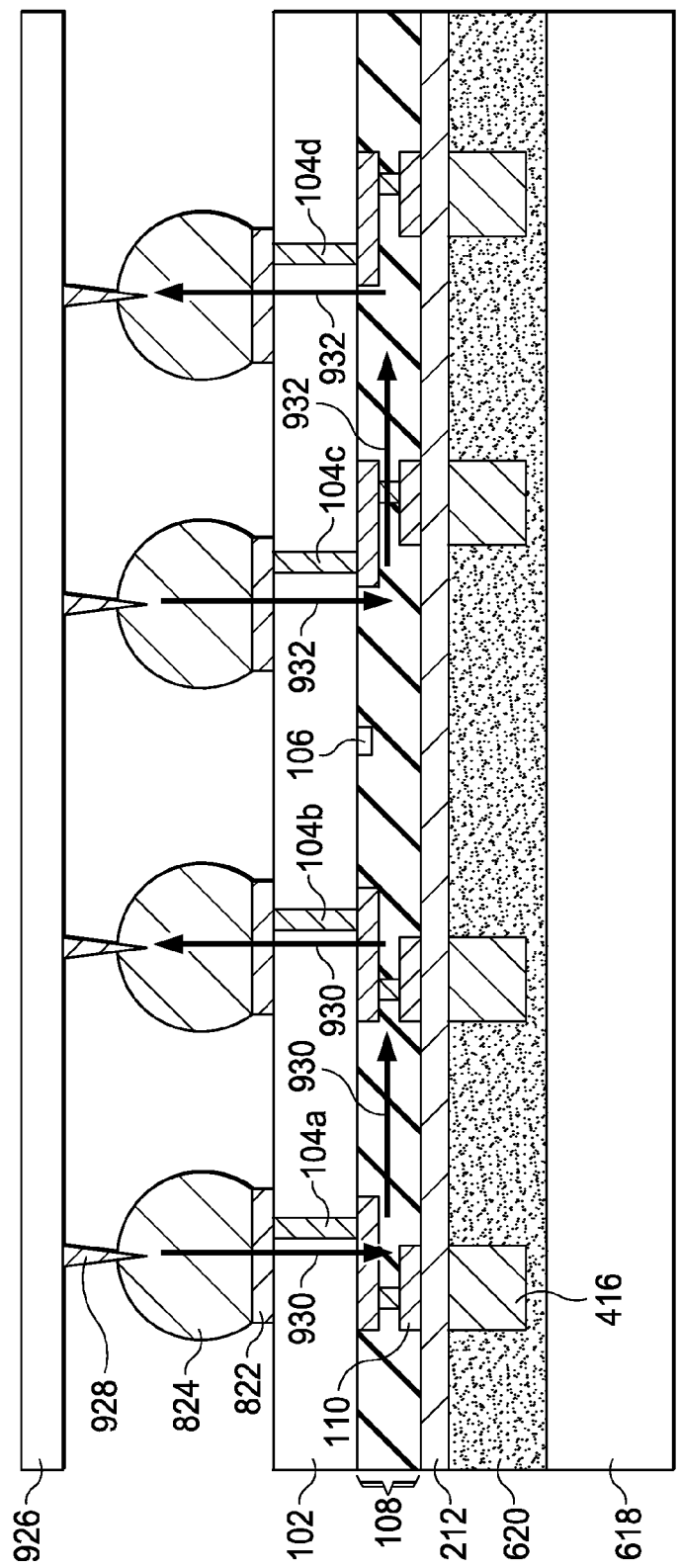

FIG. 9 illustrates a testing process of the substrate 102, including the testing of the TVs 104 formed through the substrate 102, in accordance with an embodiment. Testing may be performed, for example, using a probe card 926. Generally, the probe card 926 includes a plurality of probe pins 928. Probe pins 928 are put into contact with respective ones of the second conductive bumps 824 as illustrated in FIG. 9.

In an embodiment, the probe pins 928 are designed to match the pitches and the distribution of the second conductive bumps 824, thereby providing a method to quickly and easily test multiple connections. The electrical connections to the probe pins 928, and hence the specific second conductive bumps 824 and specific circuitry and/or TVs 104 on the substrate 102, may be controlled by an automated test equipment (ATE) system (not shown).

It should be appreciated that the conductive layer 212 interconnects two or more of the TVs 104, thereby allowing current to flow from the probe card 926 through one TV, through the conductive layer 212, and through another TV back to the probe card 926, thereby testing the electrical characteristics, such as electrical continuity, of the TVs 104. For example, arrows 930 and 932 illustrate an embodiment in which the probe card 926 is configured to create various circuits or loops that may be utilized to test the TVs 104. A circuit illustrated by arrows 930 may be tested by closing a circuit including TV 104a, the conductive layer 212, TV 104b, and the probe card 926, leaving the electrical connections to the second conductive bumps 824 coupled to TVs 104c and 104d in an open state, thereby testing the electrical characteristics of the TVs 104a and 104b. Similarly, a circuit illustrated by arrows 932 may be tested by leaving the electrical connections to the second conductive bumps 824 coupled to TV 104a and 104b in an open state while closing the circuit formed by TV 104c, the conductive layer 212, the TV 104d, and the probe card 926. These are but two examples provided for illustrative purposes. One of ordinary skill in the art will realize that various other circuits may be formed to create various other test patterns, including applying a voltage to one of the second conductive bumps and measuring the current on all of the other second conductive bumps.

Figure 10:
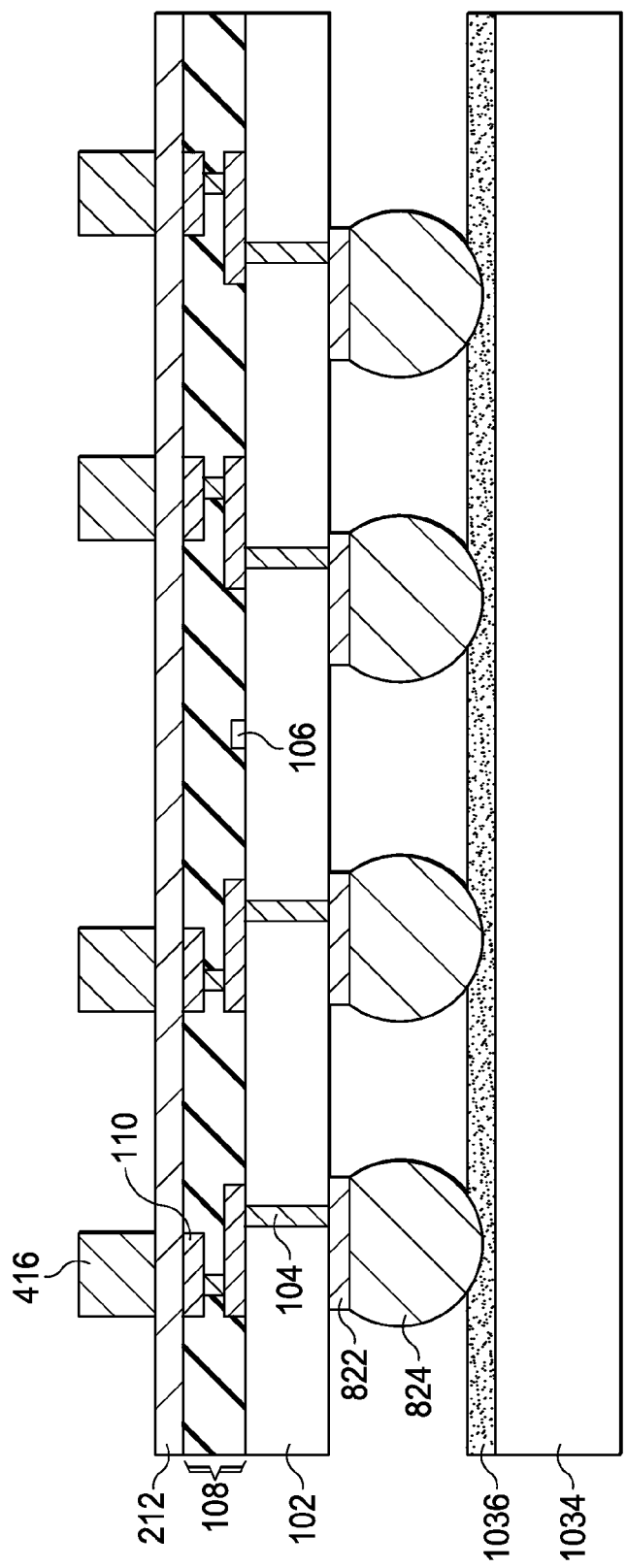

FIG. 10 illustrates attaching a second carrier wafer 1034 and removing the first carrier wafer 618 after completing the above testing procedure. The second carrier wafer 1034 may be similar to the first carrier wafer 618 and may be attached using a second adhesive 1036, such as a UV glue.

Figure 11:
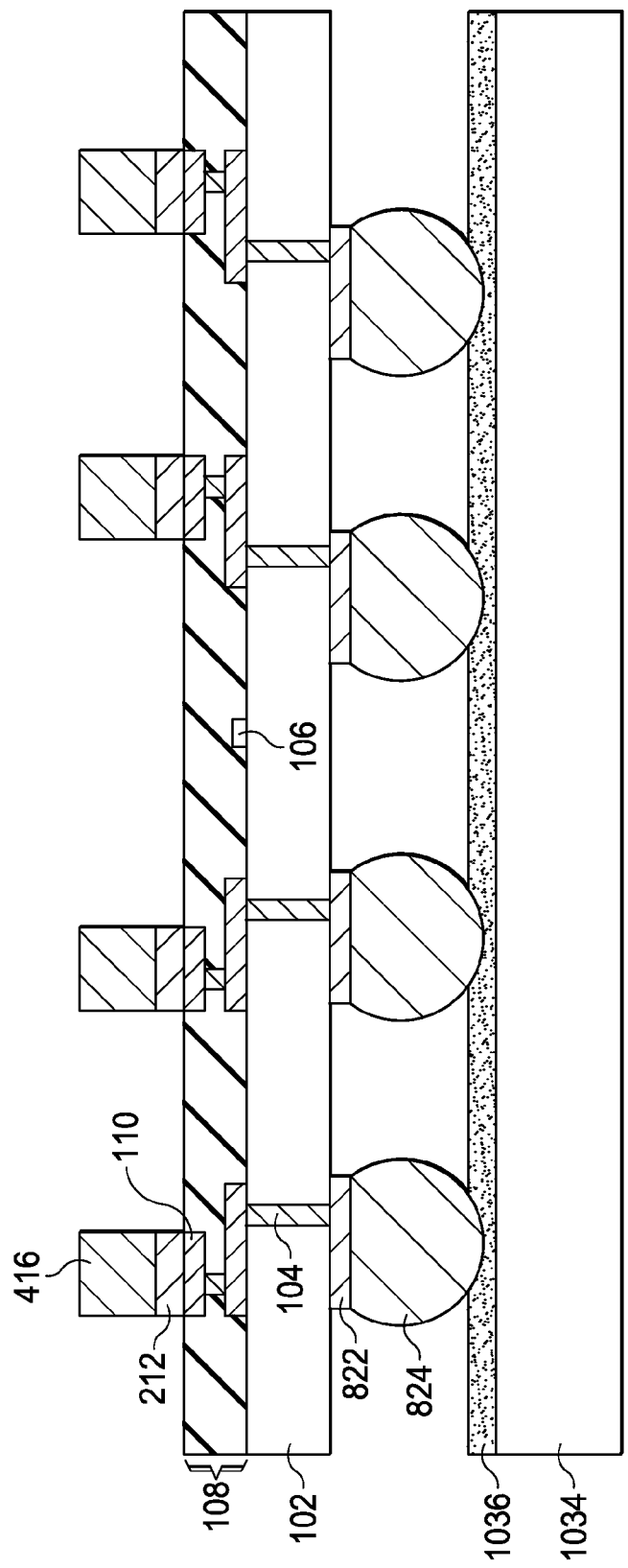

In an embodiment in which a UV glue is used as the first adhesive 620 to attach the first carrier wafer 618, the UV glue is exposed to UV light, thereby causing the UV glue, for example, to become non-adhesive. Thereafter, the first carrier wafer 618 may be easily detached. Other types of adhesive may be used, which may be released using, for example, thermal, solvent/plasma stripper, laser, or the like techniques FIG. 11 illustrates patterning of the conductive layer 212. As noted above, the conductive layer 212 was utilized as a temporary conductive layer to aid in testing the electrical characteristics of the TVs 104, thereby detecting bad dies earlier in the process. As such, after testing is completed and the known good dies (at least with respect to the TVs 102), the conductive layer may be patterned. In an embodiment in which the conductive layer 212 comprises a copper seed layer, the patterning process may be similar to a cleaning process, such as a wet dip in a chemical solution of phosphoric acid ($H_3PO_4$) and hydrogen peroxide ($H_2O_2$), referred to as DPP, with 2% hydrofluoric (HF) acid, or another cleaning process, may be performed to remove exposed portions of the conductive layer 212 and any contaminants from the surface of the passivation layer 220.

It should be noted that many variations of the above process may be used, and as such, the ordering of the steps may vary from embodiment to embodiment. For example, the TVs may be tested at any point after the conductive layer 212 is formed. Thus, in other embodiments, a carrier substrate may be attached after FIG. 2 and the TVs completed and tested. Formation of the first conductive bumps may be performed after testing of the TVs. Furthermore, some steps may be optional, such as forming the second conductive bumps prior to testing the TVs. In some embodiments, the TVs may be tested prior to formation of the second conductive bumps.

In an embodiment, a method is provided that includes providing a substrate and forming a plurality of TVs extending through the substrate. A first electrical connection to a first TV is formed on a first side of the substrate, a second electrical connection to a second TV on the first side of the substrate is formed. Along the second side of the substrate, the first TV to the second TV are electrically coupled.

In another embodiment, a method is provided that includes providing a test structure, the test structure having a substrate with a first conductive element and a second conductive element on a first side of the test structure, the first conductive element being electrically coupled to a first through via (TV), the second conductive element being electrically coupled to a second TV, the first TV and the second TV being electrically coupled together. Testing of the electrical characteristics of the first TV and the second TV is performed by applying a test voltage to the first conductive element and the second conductive element.

In yet another embodiment, an apparatus comprising a substrate having a first side and a second side is provided. A first plurality of electrical connections is on the first side of the substrate, and a second plurality of electrical connections is on the second side of the substrate. The substrate has a plurality of through vias (TVs) formed therethrough, wherein respective ones of the plurality of TVs electrically couple respective ones of the first plurality of electrical connections and the second plurality of electrical connections. An electrical connection between two or more of the second plurality of electrical connections electrically connects respective ones of the plurality of TVs.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    providing a substrate;
    forming a plurality of through vias (TVs) extending through the substrate;
    forming a first electrical connection to a first TV on a first side of the substrate;
    forming a second electrical connection to a second TV on the first side of the substrate; and
    electrically coupling the first TV to the second TV on a second side of the substrate, the first TV electrically coupled to the second TV by a conductive material extending directly from the first TV to the second TV.

2. The method of claim 1, wherein the electrically coupling comprises forming a conductive layer over the second side of the substrate.

3. The method of claim 1, wherein the forming the first electrical connection comprises forming conductive bumps.

4. The method of claim 3, wherein the forming conductive bumps comprises forming solder bumps.

5. The method of claim 1, wherein the forming the second electrical connection comprises forming conductive bumps.

6. The method of claim 1, further comprising testing the electrical continuity of the first TV and the second TV by applying a test voltage to the first electrical connection and the second electrical connection.

7. The method of claim 1, wherein the electrically coupling is performed at least in part by forming a conductive layer over the second side of the substrate below the first electrical connection.

8. The method of claim 1, further comprising forming active circuitry formed on the substrate.

9. A method comprising:
    providing a test structure, the test structure having a substrate with a first conductive element and a second conductive element on a first side of the test structure, the first conductive element being electrically coupled to a first through via (TV), the second conductive element being electrically coupled to a second TV, the first TV and the second TV being electrically coupled together;
    testing the electrical characteristics of the first TV and the second TV by applying a test voltage to the first conductive element and the second conductive element; and
    after the testing, electrically disconnecting the first TV from the second TV.

10. The method of claim 9, wherein the first TV and the second TV are electrically coupled via one or more conductive lines on a second side of the substrate.

11. The method of claim 10, wherein the first TV and the second TV are electrically coupled via a conductive line underlying an external contact.

12. The method of claim 11, wherein the external contact is a conductive bump.

13. The method of claim 9, wherein the test structure further comprises additional TVs, the additional TVs being electrically coupled to the first TV and the second TV.

14. A method comprising:
    providing a test structure, the providing the test structure comprising:
        providing a substrate;
        forming a plurality of through vias (TVs) in the substrate, the TVs providing an electrical connection on a backside of the substrate to devices formed on a device side of the substrate; and
        forming a conductive layer on a device side of the substrate, the conductive layer electrically coupling the plurality of TVs to each other;
    electrically testing the test structure by applying test voltages to the plurality of TVs from the backside of the substrate; and
    after the electrically testing, removing at least a portion of the conductive layer to electrically isolating individual ones of the plurality of TVs.

15. The method of claim 14, further comprising forming conductive bumps on the backside of the substrate, the conductive bumps providing an electrical connection to respective ones of the TVs.

16. The method of claim 14, further comprising forming conductive pillars over the conductive layer.

17. The method of claim 16, further comprising, after the electrically testing, removing a portion of the conductive layer using the conductive pillars as a mask.

18. The method of claim 17, further comprising placing a solder bump over the conductive pillars.

19. The method of claim 16, further comprising, after the forming the conductive pillars, attaching the conductive pillars to a carrier substrate.

20. The method of claim 1, further comprising attaching the substrate to a carrier substrate, the second side of the substrate facing the carrier substrate.

* * * * *